(12) United States Patent
Seita

(10) Patent No.: US 6,943,899 B2
(45) Date of Patent: Sep. 13, 2005

(54) SUBSTRATE-CONTAINER MEASURING DEVICE, AND SUBSTRATE-CONTAINER MEASURING JIG

(75) Inventor: Hisaharu Seita, Kanagawa (JP)

(73) Assignee: Semiconductor Leading Edge Technologies, Inc., Ibaraki (JP)

(*) Notice: Subject to any disclaimer, the term of this patent is extended or adjusted under 35 U.S.C. 154(b) by 413 days.

(21) Appl. No.: 10/210,208

(22) Filed: Aug. 2, 2002

(65) Prior Publication Data

US 2003/0046998 A1 Mar. 13, 2003

(30) Foreign Application Priority Data

Aug. 6, 2001 (JP) ........................................ 2001-237787

(51) Int. Cl.[7] .................................................. G01N 21/01
(52) U.S. Cl. ........................................ 356/601; 356/244
(58) Field of Search ................................ 356/601, 625, 356/244, 237.1

(56) References Cited

U.S. PATENT DOCUMENTS 6,760,115 B2 * 7/2004 Shimizu et al. ............. 356/601
6,762,399 B2 * 7/2004 Shimizu ..................... 356/601

FOREIGN PATENT DOCUMENTS

JP 2001-189371 7/2001

* cited by examiner

Primary Examiner—Richard A. Rosenberger
(74) Attorney, Agent, or Firm—Foley & Lardner LLP

(57) ABSTRACT

A substrate-container measuring device has a kinematic plate 10 having securing pins 12 provided at positions defined by the SEMI standards. There is provided an optical distance-measuring sensor 14, in which a relative position between the optical distance-measuring sensor 14 and the kinematic plate 10 is fixed. A substrate-container measuring jig 20 is placed on the kinematic plate 10. The substrate-container measuring jig 20 has a base plate 22 to be placed on the kinematic plate 10, and a slide plate 24 that is slidable over the base plate 22. The base plate 22 has a group of grooves which uniquely determine a relative position between the base plate 22 and the kinematic plate 10 as a result of being fitted with the corresponding securing pins 12.

14 Claims, 2 Drawing Sheets

SUBSTRATE-CONTAINER MEASURING DEVICE, AND SUBSTRATE-CONTAINER MEASURING JIG

BACKGROUND OF THE INVENTION

1. Field of the Invention

The invention relates to a substrate-container measuring device and to a substrate-container measuring jig. Particularly, the invention relates to a substrate-container measuring device and a substrate-container measuring jig, which are useful for accurately measuring outer dimensions of a substrate-container used for transporting substrates in a factory for manufacturing semiconductor devices or liquid-crystal display devices.

2. Description of the Background Art

In a factory for manufacturing semiconductor devices or liquid-crystal display devices, substrates are usually transported while housed in a substrate-container. A FOUP (front opening unified pod) for wafers having a size of 300 mm or more is conceived as a container to be utilized for such an application. The FOUP has a door in the front thereof, and a plurality of substrates are housed in the FOUP. After being housed, the substrates are sealed and can be automatically transported at high speed.

As a result of being housed in the FOUP, the substrates are transported to a substrate processing system without being exposed to an atmosphere having a low level of cleanliness. In an individual processing device, the door of the FOUP is opened and closed by an opener (or a load port) such that an internal space of the FOUP is brought in mutual communication with only an internal space of the substrate processing system. The inside of an enclosure of the substrate processing system is maintained at a high level of cleanliness. Under the transport method using a FOUP, substrates are sequentially advanced through a plurality of processes without being exposed to an atmosphere having a low level of cleanliness by employing a mini-environment.

For managing a FOUP appropriately such that substrates are maintained at a high level of cleanliness in a low-level environment and problems in relation to opening and closing actions of FOUP or automatic transportation are prevented from arising, it is required to accurately measure outer dimensions of the FOUP. A known method for measuring outer dimensions of a three-dimensional object, such as a FOUP, is a contact-type measurement method for mechanically measuring dimensions of the object by means of actuating a measurement probe or the like through use of a robot.

However, various difficulties are encountered in achieving extremely high measurement precision through use of the contact-type measurement method. For this reason, as the degree of measurement precision required for managing a FOUP is increased, managing the FOUP with use of the measurement method involving use of a mechanical contact-type probe becomes more difficult.

In order to measure a three-dimensional object with high accuracy, utilization of a non-contact-type measurement method using an optical distance-measuring sensor is conceivable. However, in relation to a measurement method using a distance-measuring sensor, a tradeoff exists between a focal depth of a distance-measuring sensor and the accuracy of dimensional measurement. For this reason, when the method using a distance-measuring sensor is applied to dimensional measurement of a FOUP, a measurable range becomes considerably narrow, thereby posing great difficulty in capturing an object of measurement within the measurable range.

SUMMARY OF THE INVENTION

The invention has been conceived to solve the problem set forth, and a first object of the invention is to provide a substrate-container measuring device which enables considerably accurate measurement of outer dimensions of a substrate-container through use of an optical distance-measuring sensor and facilitation of an operation for capturing an object of measurement within a shallow focal depth of the distance-measuring sensor.

A second object of the invention is to provide a substrate-container measuring jig to be used for embodying the substrate-container measuring device by use of a general-purpose measurement device.

The above objects of the present invention are achieved by a substrate-container measuring device for measuring a substrate-container which houses substrates. The device includes a kinematic plate having securing pins provided at predetermined positions. The device also includes an optical distance-measuring sensor which enables fixing of a relative positional relationship with respect to the kinematic plate and measurement of a distance to an object located in a predetermined measurement direction. Further, the device includes a substrate-container measurement jig to be placed on the kinematic plate. The substrate-container measurement jig includes a base plate to be placed on the kinematic plate and a slide plate which enables to slide over the base plate while carrying the substrate-container. The base plate has a group of grooves which uniquely fixes a relative positional relationship between the base plate and the kinematic plate as a result of fitting with the securing pins.

The above objects of the present invention are also achieved by a substrate-container measuring jig to be used for measuring a substrate-container which houses substrates. The jig includes a base plate, on whose back are provided a group of grooves. The jig also includes a slide plate which enables to slide over the base plate while carrying the substrate-container. The group of grooves are formed so as to be able to fit with securing pins provided on a kinematic plate, thereby fixing a relative positional relationship existing between the base plate and the kinematic plate.

Other objects and further features of the present invention will be apparent from the following detailed description when read in conjunction with the accompanying drawings.

DESCRIPTION OF THE PREFERRED EMBODIMENTS

Figure 1:
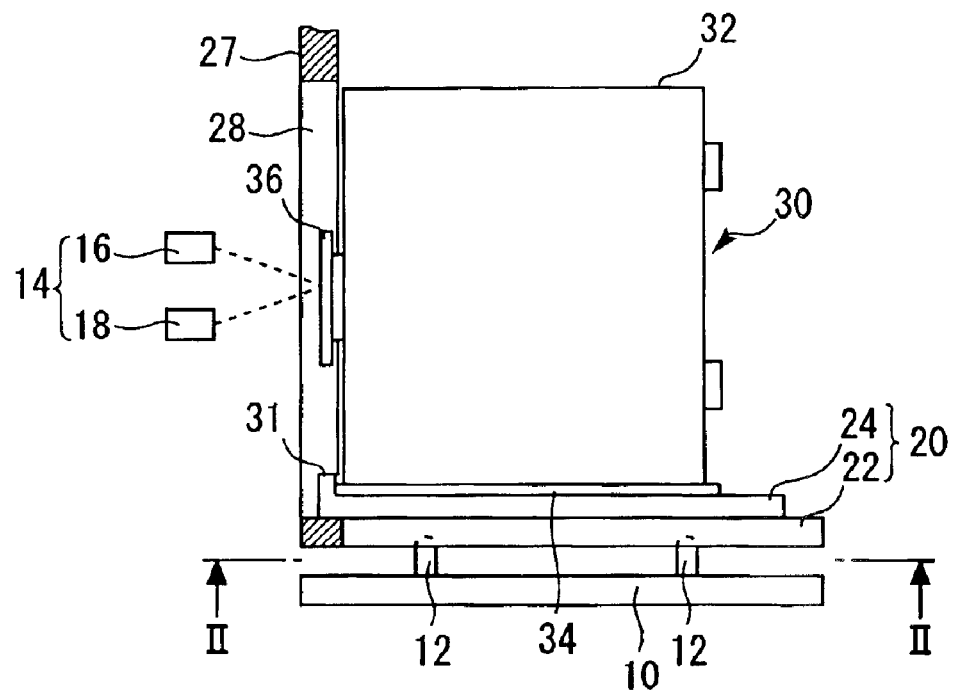
FIG. 1 is a view for describing the structure of the primary section of a substrate-container measuring device according to an embodiment of the invention.

An embodiment of the invention will be described hereinbelow by reference to the drawings. Elements commonly appearing throughout the drawings are assigned identical reference numerals, and their repeated explanations are omitted.

FIG. 1 is a view for describing the structure of the primary section of a substrate-container measuring device according to an embodiment of the invention.

As shown in FIG. 1, the substrate-container measuring device of the embodiment has a kinematic plate 10. The kinematic plate 10 is a member fixed to a body of the substrate-container measuring device. The kinematic plate 10 has securing pins 12 which are provided in accordance with SEMI (semiconductor equipment material international) standards (e.g., E-57, E62) pertaining to a kinematic plate. As will be described later, three securing pins 12 are provided on the surface of the kinematic plate 10 so as to situate at the respective apices of a predetermined triangular shape.

The substrate-container measuring device also has an optical distance-measuring sensor 14. The distance-measuring sensor 14 has a light-emitting section 16 and a light-receiving section 18 and can measure a distance to an object located in a predetermined measurement direction (i.e., a rightward horizontal direction in FIG. 1). Specifically, the distance-measuring sensor 14 has a measurable range which exists at a predetermined distance from the distance-measuring sensor 14 in the measurement direction. When an object is placed in the range, the distance-measuring sensor 14 can measure a distance between the sensor and the object. In the embodiment, the distance-measuring sensor 14 is held by an unillustrated support section which enables to lock a relative positional relationship between the kinematic plate 10 and the sensor 14.

A substrate-container measuring jig 20 is placed on the kinematic plate 10. The substrate-container measuring jig 20 has a base plate 22 and a slide plate 24. The base plate 22 has a plurality of grooves 26, more specifically, a V group consisting of three grooves 26 which is formed in accordance with the SEMI standards (e.g., E47.1 Pods Std.) pertaining to a FOUP.

Figure 2:
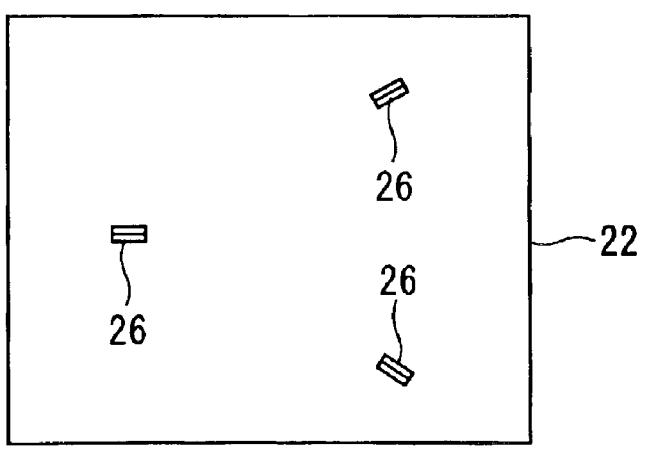
FIG. 2 is a view of a base plate when viewed along line II—II shown in FIG. 1.

FIG. 2 is a view of the base plate 22 when viewed along line II—II shown in FIG. 1. The three grooves 26 formed in the base plate 22 are V-shaped grooves. The grooves 26 are provided on the back of the base plate 22 in a layout such as that shown in FIG. 2. The grooves 26 are provided so as to fit with the corresponding securing pints 12 provided on the kinematic plate 10 and such that a relative positional relationship between the base plate 22 and the kinematic plate 10 is determined uniquely as a result of provision of the grooves 26.

The base plate 22 is further provided with a range display member 27. The range display member 27 is for displaying a measurable range of the distance-measuring sensor 14. In the embodiment, as shown in FIG. 1, the range display member 27 and the base plate 22 are provided in an L-shaped layout. Specifically, the range display member 27 shown in FIG. 1 is constituted of a frame member having a window 28 of predetermined size. The window is provided in a plane of the range display member 27 which faces the distance-measuring sensor 14 when the substrate-container measuring jig 20 is placed on the kinematic plate 10.

When the substrate-container measuring jig 20 is placed on the kinematic plate 10, a relative position between the base plate 22 and the kinematic plate 10 is locked uniquely as mentioned above. In the embodiment, a relative position between the kinematic plate 10 and the distance-measuring sensor 14 is also uniquely locked. Accordingly, under circumstances where the substrate-container measuring jig 20 is placed on the kinematic plate 10, a relative position between the measurable range of the distance-measuring sensor 14 and the range display member 27 (frame member) is fixed.

In the embodiment, under such circumstances, the range display member 27 is formed such that the thickness of the display member matches the measurable range of the distance-measuring sensor 14. Specifically, the range display member 27 is formed such that an area in the window 28 (i.e., an area enclosed by the window frame) is taken as a measurable range of the distance-measuring sensor 14.

The slide plate 24 is slidably placed on the base plate 22. More specifically, the slide plate 24 is retained on the base plate 22, by means of a first slide mechanism (not shown) which enables sliding action of the slide plate 24 in a horizontal direction shown in FIG. 1 (i.e., a first direction). For this reason, the relative position between the slide plate 24 and the distance-measuring sensor 14 can be adjusted arbitrarily within a predetermined range in only the measurement direction of the distance-measurement sensor 14 (i.e., the horizontal direction in FIG. 1).

Although in the embodiment the sliding direction of the slide plate 24 is limited to solely the first direction, the invention is not limited to this direction. In other words, along with the first slide mechanism, a second mechanism which enables sliding action of the slide plate 24 in a second direction orthogonal to the first direction or a third slide mechanism which enables sliding action of the slide plate 24 in the direction of rotation may be incorporated into the substrate-container measuring jig 20.

Placed on the slide plate 24 is a FOUP 30 for housing substrates. The slide plate 24 has a stopper 31 at an edge of a distance-measuring sensor 14 side. As shown in FIG. 1, the stopper 31 is provided such that the slide plate 24 including the stopper 31 assumes an L-shaped profile when viewed in cross section. The FOUP 30 is placed on the slide plate 24 such that a corner of the FOUP 30 comes into contact with the stopper 31. The slide plate 24 is further equipped with a clamp mechanism (not shown) which secures the position of the FOUP 30 in the above-mentioned state. The position of the FOUP 30 on the slide plate 24 is secured by means of the foregoing stopper 31 and the clamp mechanism.

The structure of the FOUP 30 will now be described briefly by reference to FIGS. 3 and 4.

Figure 3:
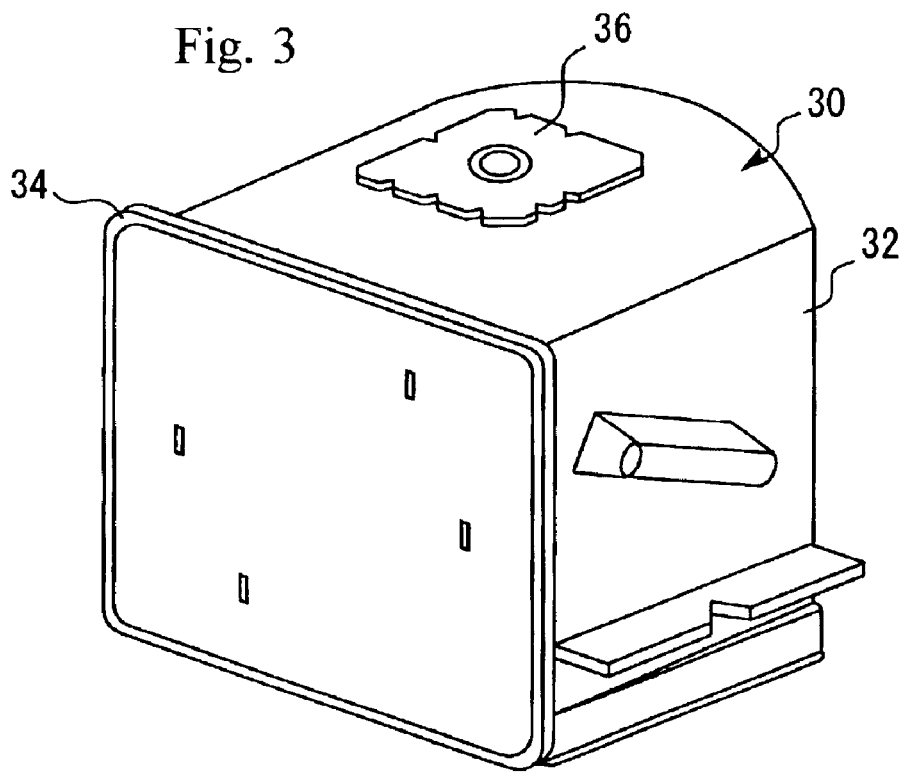
FIG. 3 is a perspective view of a FOUP.
Figure 4:
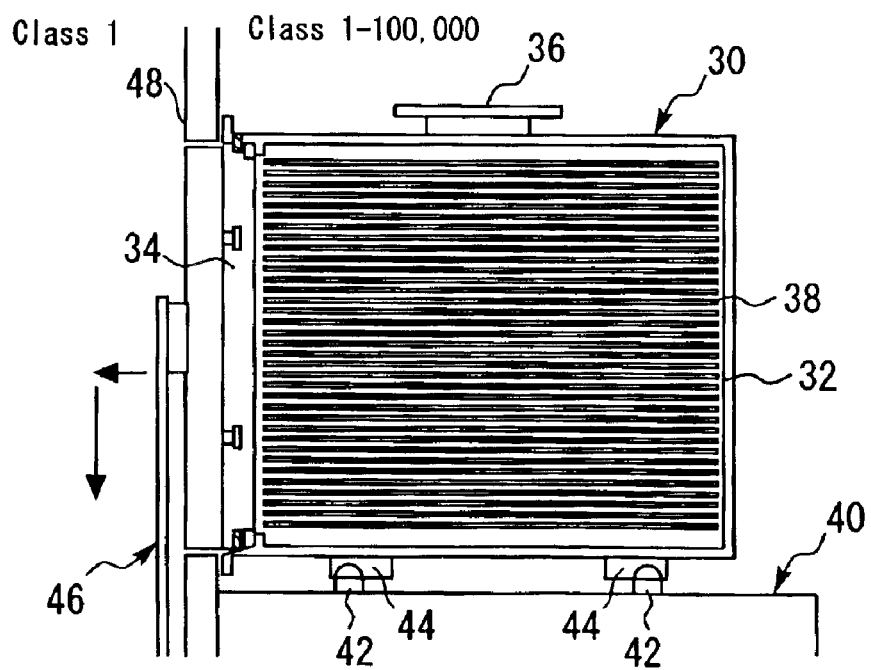
FIG. 4 is a cross-sectional view of the FOUP housing substrates.

FIG. 3 is a perspective view of the FOUP 30, and FIG. 4 is a cross-sectional view of the FOUP 30 housing substrates.

As shown in FIG. 3, the FOUP 30 has a door 34 which closes the front of a shell 32. Provided on top of the shell 32 is a flange 36 to be utilized as a grip at the time of automatic transport of the FOUP 30.

As shown in FIG. 4, a plurality of substrates 38 are housed at predetermined intervals in the FOUP 30. The FOUP 30 is transported within a semiconductor manufacturing factory while housing the substrates 38. Every substrate processing apparatus is provided with a load port 40 for handling the FOUP 30 at the front thereof.

The load port 40 has securing pins 42 satisfying the specifications defined by the SEMI standards (e.g., E-57 Kinematic coupling Std.). Formed in the bottom surface of the FOUP 30 are grooves 44 (collectively called a V group) satisfying the specifications defined by the SEMI standards (e.g., E47.1 Pods Std.). The FOUP 30 is placed on the load port 40 such that the grooves 44 fit with the corresponding securing pins 42. As a result, the position of the FOUP 30 on the load port 40 is set at a constant appropriate position at all times.

The load port 40 has an open/close mechanism 46 for opening and closing the door 34 of the FOUP 30. As shown in FIG. 4, the door 34 of the FOUP 30 is opened and closed by the open/close mechanism 46 while the shell 32 remains in intimate contact with an outer wall 48 of a manufacturing apparatus. Therefore, the substrates 38 housed in the FOUP 30 are transported into the manufacturing apparatus (e.g., class 1) or out from the same without being exposed to an atmosphere outside the manufacturing apparatus (e.g., class 1 through 100000).

In order to use the FOUP 30 in the semiconductor manufacturing factory, outer dimensions of the FOUP 30 must be managed on the order of micrometers. Thus, dimensions of individual sections of the FOUP 30, such as the dimensions of the shell 32, those of the door 34, and those of the flange 36, must be measured.

Use of an optical, non-contact-type measurement method is effective for measuring the dimensions of the FOUP 30 with required accuracy. To this end, the substrate-container measuring device of the embodiment employs the distance-measuring sensor 14 capable of ensuring high measurement accuracy, and the focal depth of the distance-measuring sensor 14 is set shallow to such an extent as to be able to satisfy the required accuracy.

In the measuring device of the embodiment, provided on top of the kinematic plate 10 are the securing pins 12 which comply with the SEMI standards, as do the securing pins 42 provided on the load port 40. By means of the pins, the FOUP 30 can be placed directly on the kinematic plate 10 without use of the substrate-container measuring jig 20 such that the grooves of the V group 44 fit with the corresponding securing pins 12.

The kinematic plate 10 and the distance-measuring sensor 14 are constructed such that the surface of the door 34 of the FOUP 30 falls within the measurable range of the distance-measuring sensor 14 when the FOUP 30 is placed directly on the kinematic plate 10 in the manner as mentioned previously. Therefore, the substrate-container measuring device of the embodiment enables easy, accurate measurement of a neighborhood of the door surface of the FOUP 30, despite the focal depth of the distance-measuring sensor 14 being extremely shallow.

While the FOUP 30 is placed directly on the kinematic plate 10, the dimensions of the FOUP 30, excluding the dimension of the neighborhood of the door surface, cannot be measured accurately. For this reason, the embodiment employs the substrate-container measuring jig 20 for enabling easy measurement of the remaining area of the FOUP 30 exclusive of the neighborhood of the door surface.

When the substrate-container measuring jig 20 is used, the FOUP 30 is placed on the jig 20 in a position such as that shown in FIG. 1, where by the flange 36 faces the distance-measuring sensor 14. Then, the slide section 24 is slid such that the flange 36 falls within the window 28 of the range display member 27 (i.e., the area enclosed by the window frame), thereby enabling the flange 36 to fall within the measurable range of the distance-measuring sensor 14.

Similarly, according to the measuring device of the present embodiment, it is possible to fall a desired measurement object within the measurable range of the distance-measuring sensor 14 without fail, by firstly placing the FOUP 30 in a desired posture on the substrate-container measuring jig 20, then sliding the slide section 24 such that the measurement object falls within the window 28 (i.e., the area enclosed by the window frame). Consequently, the substrate-container measuring device and the substrate-container measuring jig 20 of the embodiment enable easy measurement of every part of the FOUP 30 while the focal depth of the distance-measuring sensor 14 is set shallow and high measurement accuracy is ensured.

In the embodiment, the measurable range of the distance-measuring sensor 14 is indicated by the range display member 27 in the form of a window frame. However, the member to be used for indicating a measurable range is not limited to a window-frame-shaped member. Specifically, the range display member 27 may assume any shape, so long as the member can display a measurable range of the distance-measuring sensor 14.

As mentioned above, according to the present invention, use of the substrate-container measuring jig enables an arbitrary part of a substrate-container to readily fall within a measurable range of a distance-measuring sensor without fail. Therefore, the invention enables accurate measurement of every part of the substrate-container through a simple operation.

Further, the present invention is not limited to these embodiments, but variations and modifications may be made without departing from the scope of the present invention.

The entire disclosure of Japanese Patent Application No. 2001-237787 filed on Aug. 6, 2001 including specification, claims, drawings and summary are incorporated herein by reference in its entirety.

What is claimed is:

1. A substrate-container measuring device for measuring a substrate-container which houses substrates, the device comprising:

a kinematic plate having securing pins provided at predetermined positions; and an optical distance-measuring sensor which enables fixing of a relative positional relationship with respect to the kinematic plate and measurement of a distance to an object located in a predetermined measurement direction; and a substrate-container measurement jig to be placed on the kinematic plate, wherein the substrate-container measurement jig includes a base plate to be placed on the kinematic plate and a slide plate which enables to slide over the base plate while carrying the substrate-container; and the base plate has a group of grooves which uniquely fixes a relative positional relationship between the base plate and the kinematic plate as a result of fitting with the securing pins.

2. The substrate-container measuring device according to claim 1, wherein the substrate-container measuring jig has a first slide mechanism which enables sliding action of the slide plate in a first direction, and the first direction coincides with the measurement direction of the optical distance-measuring sensor when the substrate-container measuring jig is placed on the kinematic plate.

3. The substrate-container measuring device according to claim 2, wherein the substrate-container measuring jig has a second slide mechanism which enables sliding action of the slide plate in a second direction orthogonal to the first direction.

4. The substrate-container measuring device according to claim 2, wherein the substrate-container measuring jig has a third slide mechanism which enables sliding action of the slide plate in a direction of rotation.

5. The substrate-container measuring device according to claim 2, wherein the slide plate has a stopper section and a clamp mechanism for fixing position of the substrate-container in the first direction.

6. The substrate-container measuring device according to claim 1, wherein the base plate has a range display member which shows an area to fall within a measurable range of the optical sensor when placed on the kinematic plate.

7. The substrate-container measuring device according to claim 1, wherein the range display member is a window frame member which has a thickness equal to the measurable range and is secured to the base plate.

8. A substrate-container measuring jig to be used for measuring a substrate-container which houses substrates, the jig comprising:
 a base plate, on whose back are provided a group of grooves; and
 a slide plate which enables to slide over the base plate while carrying the substrate-container, wherein
 the group of grooves are formed so as to be able to fit with securing pins provided on a kinematic plate, thereby fixing a relative positional relationship existing between the base plate and the kinematic plate.

9. The substrate-container measuring jig according to claim 8, further comprising a first slide mechanism which enables sliding action of the slide plate in a first direction.

10. The substrate-container measuring jig according to claim 9, wherein the substrate-container measuring jig has a second slide mechanism which enables sliding action of the slide plate in a second direction orthogonal to the first direction.

11. The substrate-container measuring jig according to claim 9, wherein the substrate-container measuring jig has a third slide mechanism which enables sliding action of the slide plate in a direction of rotation.

12. The substrate-container measuring jig according to claim 9, wherein the slide plate has a stopper section and a clamp mechanism for fixing position of the substrate-container in the first direction.

13. The substrate-container measuring jig according to claim 9, wherein the base plate has a range display member which shows, in a space over the slide plate, a predetermined range having a predetermined width in the first direction.

14. The substrate-container measuring jig according to claim 13, wherein the range display member is a window frame member which has a thickness equal to the predetermined range and is secured to the base plate.

* * * * *